United States Patent
Chada et al.

(10) Patent No.: US 10,128,903 B2
(45) Date of Patent: *Nov. 13, 2018

(54) SYSTEM AND METHOD OF CANCELLING FLOQUET MODE RESONANCE AND FAR END CROSSTALK, AND MITIGATING CROSSTALK IN A PRINTED CIRCUIT BOARD

(71) Applicant: DELL PRODUCTS, LP, Round Rock, TX (US)

(72) Inventors: Arun R. Chada, Round Rock, TX (US); Bhyrav M. Mutnury, Round Rock, TX (US)

(73) Assignee: DELL PRODUCTS, LP, Round Rock, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/347,250

(22) Filed: Nov. 9, 2016

(65) Prior Publication Data

US 2018/0131405 A1    May 10, 2018

(51) Int. Cl.
*H04B 3/32* (2006.01)
*H05K 1/02* (2006.01)
*H04B 3/487* (2015.01)

(52) U.S. Cl.
CPC .............. *H04B 3/32* (2013.01); *H04B 3/487* (2015.01); *H05K 1/0228* (2013.01); *H05K 1/0245* (2013.01); *H05K 2201/0715* (2013.01); *H05K 2201/09236* (2013.01)

(58) Field of Classification Search
CPC .................................................. H05K 1/0245
See application file for complete search history.

(56) References Cited

U.S. PATENT DOCUMENTS

| | | | |
|---|---|---|---|
| 5,027,088 A | 6/1991 | Shimizu et al. | |
| 8,536,456 B2* | 9/2013 | Chen | H05K 1/0251 174/251 |
| 9,317,649 B2* | 4/2016 | Mutnury | G06F 17/5081 |
| 2007/0190863 A1* | 8/2007 | Caveney | H05K 1/0228 439/676 |
| 2008/0010622 A1* | 1/2008 | Hsu | G06F 17/5036 716/111 |
| 2008/0238584 A1 | 10/2008 | Kunze et al. | |
| 2008/0280566 A1* | 11/2008 | Yen | H04B 17/3911 455/67.11 |
| 2010/0259337 A1 | 10/2010 | Tabatabai | |
| 2012/0146748 A1* | 6/2012 | Tabatabai | H01P 3/026 333/238 |
| 2012/0160542 A1* | 6/2012 | Oluwafemi | H05K 1/0245 174/250 |

(Continued)

*Primary Examiner* — Ross Varndell
(74) *Attorney, Agent, or Firm* — Larson Newman, LLP

(57) ABSTRACT

A method includes providing a first circuit trace and a second circuit trace on a printed circuit board, determining a far end cross-talk (FEXT) response associated with the first circuit trace, determining a time delay associated with the second circuit trace, estimating a floquet response associated with the time delay, comparing the FEXT response with an interface frequency associated with the first circuit trace, comparing the floquet response with the interface frequency, and determining whether the floquet response cancels the FEXT response on the first circuit trace at the interface frequency.

20 Claims, 5 Drawing Sheets

(56) References Cited

U.S. PATENT DOCUMENTS

2013/0130560 A1* 5/2013 Bolouri-Saransar ........................ H01R 23/005 439/676
2015/0171498 A1 6/2015 McKinzie, III
2016/0085902 A1* 3/2016 Mutnury ............. G06F 17/5031 716/137

\* cited by examiner

300

400

SYSTEM AND METHOD OF CANCELLING FLOQUET MODE RESONANCE AND FAR END CROSSTALK, AND MITIGATING CROSSTALK IN A PRINTED CIRCUIT BOARD

CROSS-REFERENCE TO RELATED APPLICATION

Related subject matter is contained in co-pending U.S. patent application No. 15/347,286 entitled " System and Method of Crosstalk Mitigation in Microstrip Serial Links in a Printed Circuit Board," filed on Nov. 9, 2016, the disclosure of which is hereby incorporated by reference.

FIELD OF THE DISCLOSURE

This disclosure generally relates to information handling systems, and more particularly relates to a system and method of cancelling floquet mode resonance and far end crosstalk.

BACKGROUND

As the value and use of information continues to increase, individuals and businesses seek additional ways to process and store information. One option is an information handling system. An information handling system generally processes, compiles, stores, and/or communicates information or data for business, personal, or other purposes. Because technology and information handling needs and requirements may vary between different applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, reservations, enterprise data storage, or global communications. In addition, information handling systems may include a variety of hardware and software resources that may be configured to process, store, and communicate information and may include one or more computer systems, data storage systems, and networking systems.

BRIEF DESCRIPTION OF THE DRAWINGS

It will be appreciated that for simplicity and clarity of illustration, elements illustrated in the Figures have not necessarily been drawn to scale. For example, the dimensions of some of the elements are exaggerated relative to other elements. Embodiments incorporating teachings of the present disclosure are shown and described with respect to the drawings presented herein, in which.

The use of the same reference symbols in different drawings indicates similar or identical items.

SUMMARY

A method can include providing a first circuit trace and a second circuit trace on a printed circuit board, determining a far end crosstalk (FEXT) response associated with the first circuit trace, determining a time delay associated with the second circuit trace, estimating a floquet response associated with the time delay, comparing the FEXT response with an interface frequency associated with the first circuit trace, comparing the floquet response with the interface frequency, and determining whether the floquet response cancels the FEXT response on the first circuit trace at the interface frequency.

DETAILED DESCRIPTION OF DRAWINGS

The following description in combination with the Figures is provided to assist in understanding the teachings disclosed herein. The following discussion will focus on specific implementations and embodiments of the teachings. This focus is provided to assist in describing the teachings, and should not be interpreted as a limitation on the scope or applicability of the teachings. However, other teachings can certainly be used in this application. The teachings can also be used in other applications, and with several different types of architectures, such as distributed computing architectures, client/server architectures, or middleware server architectures and associated resources.

A printed circuit board for an information handling system can utilize broadside stack-ups, with two or more routing layers stacked between the power plane layers. In this way, the number of routing layers is increased for the same overall number of layers in the printed circuit board stack-up. A printed circuit board using broadside stack-ups can suffer adverse coupling effects between the stacked routing layers. For this reason, circuit traces can be angularly routed, that is, routed in a zigzag pattern, in a printed circuit board, that is, routed in a zigzag pattern, to mitigate the coupling effects. However, angular routing can still result in floquet mode coupling, that is, resonant coupling based upon the periodicity of the angularly routed circuit traces, and thus to undesirable insertion loss and crosstalk in the signals carried by the angularly routed circuit traces.

Figure 1:
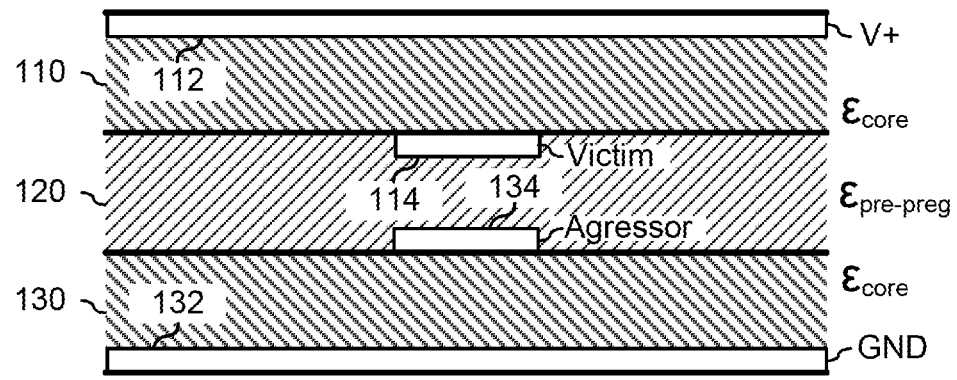
FIG. 1 is a cross-sectional view of a printed circuit board that utilizes a broadside coupled strip line stack-up according to an embodiment of the present disclosure.

FIG. 1 illustrates a printed circuit board 100 that utilizes a broadside coupled stripline stack-up, including a core layer 110, a pre-impregnated composite fiber (pre-preg) layer 120, and a second core layer 130. Core layers 110 and 130 represent two-sided copper-clad laminate layers upon which circuit traces are etched. Pre-preg layer 120 represents a laminate layer that does not include circuit traces, and that provides separation between the circuit traces of core layers 110 and 130. An example of a laminate layer includes an epoxy laminate, a composite fiber laminate, a FR-2 laminate, a FR-4 laminate, or another laminate material, as needed or desired, and can include a composite fiber matrix such as fiberglass cloth, carbon fiber matrix, that is pre-impregnated with the laminate material. Core layer 110 includes a power plane 112 and a circuit trace 114. Core layers 110 and 130 have a dielectric constant, also referred to as a relative permeability, given by $\varepsilon_{core}$, and pre-preg layer 120 has a dielectric constant given by $\varepsilon_{pre-preg}$.

Core layer 130 includes a power plane 132 and a circuit trace 134. Power planes 112 and 132 represent the nodes of a power supply including a positive supply voltage (V+) associated with power plane 112 and a reference supply voltage (GND) associated with power plane 132. Circuit traces 114 and 134 represent signal carrying traces for different signals in an information handling system that is instantiated on printed circuit board 100. Circuit traces 114 and 134 will be understood to be viewed edge-on, and will extend into printed circuit board 100, passing to one or more surfaces of the printed circuit board to connect to devices which terminate the circuit traces. In a particular embodiment, one or more of circuit traces 114 and 134 are routed angularly, that is, in a zigzag pattern. Circuit trace 114 is illustrated as being a victim trace, and circuit trace 134 is illustrated as being an aggressor trace, however, the designation of victim and aggressor is arbitrary for the purpose of this disclosure.

Figure 2:
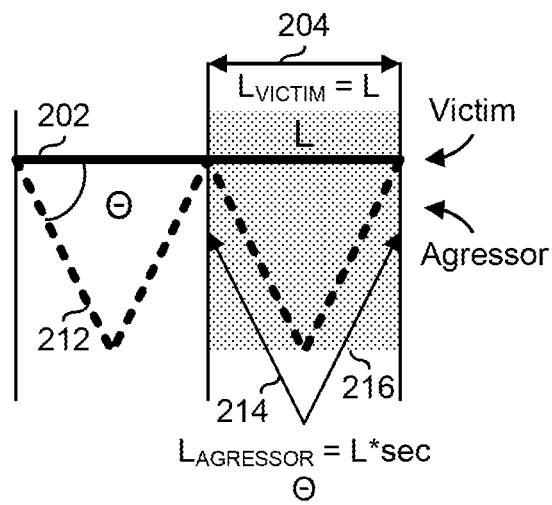
FIG. 2 illustrates exemplary trace routings of circuit traces on the printed circuit board of FIG. 1.

FIG. 2 illustrates exemplary trace routings 200 of circuit traces on a printed circuit board similar to printed circuit board 100. Trace routing 200 illustrates a victim trace 202 that is a straight routing that has a unit cell length 204 ($L_{VICTIM}$) that is equal to L, as described below. Trace routing 200 also illustrates an aggressor trace 212 that is angularly routed, with a routing angle of θ. A unit cell 216 of aggressor trace 212 is shown as encompassing a single cycle of the trace layout and has a cell length of L. Thus, for convenience, the unit cell length of victim trace 202 is set to be the same as the unit cell length of aggressor trace 212. Thus, given a routing angle of θ, and a unit cell length of L, it will be understood that a unit cell length 214 of aggressor trace is given as:

$$L_{AGGRESSOR} = L * \sec\theta \qquad \text{Equation 1}$$

Other trace routings can be utilized as needed or desired. For example, a pair of trace routings can each be provided that utilize angular routing, where each trace has a different routing angle, such as $\theta_{VICTIM}$ and $\theta_{AGGRESSOR}$, and where each trace has a different unit cell length, such as $L_{VICTIM}$ and $L_{AGGRESSOR}$.

Figure 3:
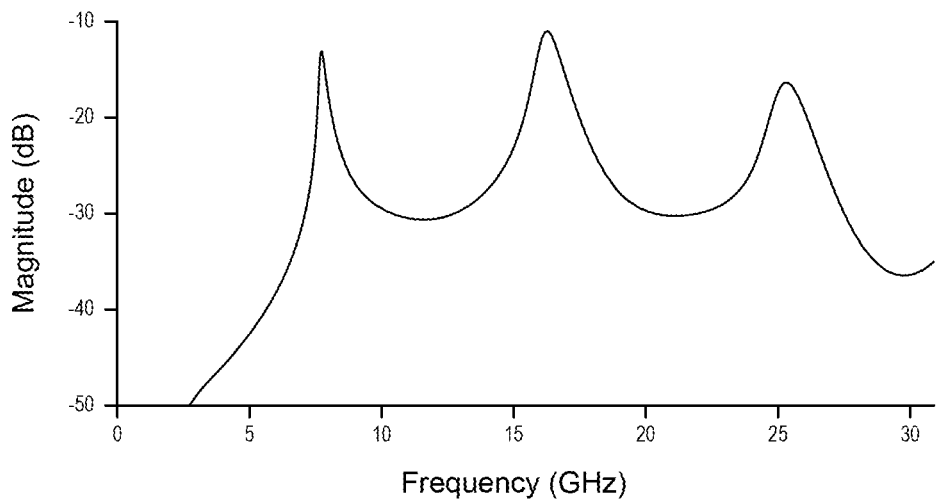
FIG. 3 is a floquet coupling transmission diagram for angularly routed circuit traces of FIG. 2.

In a particular embodiment, the floquet mode coupling in trace routings 200 can be determined by applying a field solver that evaluates the electromagnetic interactions between traces 202 and 212. Such a field solver can analyze such factors including the geometry of traces 202 and 212, the spacings between the traces, the overall length of the traces, the dielectric constant of the laminate layers that make up the printed circuit board, and the like, to determine if the traces will meet a particular design specification. The design specification can include recommended or required values for maximum insertion loss, crosstalk, and the like. If traces 202 and 212 do not meet the design specification, then a designer can re-layout the traces to improve their performance. In a particular embodiment, an analysis of traces 202 and 212 can provide a floquet coupling transmission diagram such as is shown in FIG. 3, where the floquet frequency for an exemplary circuit trace is shown to be approximately 25 gigahertz (GHz). Here, if the operating frequency of the exemplary circuit trace is expected to be near to the floquet frequency, then the designer may consider redesigning the circuit trace in order to minimize the floquet coupling with the circuit trace.

Figure 4:
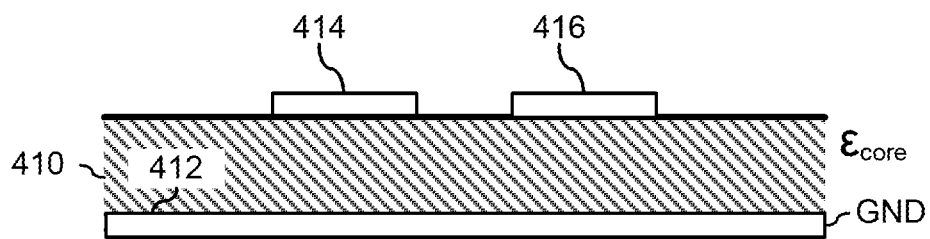
FIG. 4 a cross-sectional view of a printed circuit board that provides microstrip circuit traces according to an embodiment of the present disclosure.

FIG. 4 illustrates a microstrip printed circuit board 400 similar to stripline printed circuit board 100, including a prepreg layer 410 that includes one copper laminate layer upon which circuit traces are etched. Prepreg layer 410 includes a power plane 412 and a victim trace 414 and an aggressor trace 416. Prepreg layer 410 has a dielectric constant, also referred to as a relative permeability, given by $\varepsilon_{core}$. Power plane 412 represents the node of a power supply, such as a positive supply voltage (V+) or a reference supply voltage (GND). Circuit traces 414 and 416 represent signal carrying traces for different signals in an information handling system that is instantiated on printed circuit board 400. Circuit traces 414 and 416 will be understood to be viewed edge-on, and will extend into printed circuit board 400, and to be provided on the surface of the printed circuit board to connect to devices which terminate the circuit traces. Circuit trace 414 is similar to victim trace 202 of FIG. 2, in that the circuit trace is not necessarily routed angularly. Circuit trace 416 is similar to victim trace 212 of FIG. 2, in that the circuit trace is routed angularly. Other trace routings can be utilized as needed or desired. For example, a pair of trace routings can each be provided that utilize angular routing, where each trace has a different routing angle, such as $\theta_{VICTIM}$ and $\theta_{AGGRESSOR}$, and where each trace has a different unit cell length, such as $L_{VICTIM}$ and $L_{AGGRESSOR}$.

Figure 5:
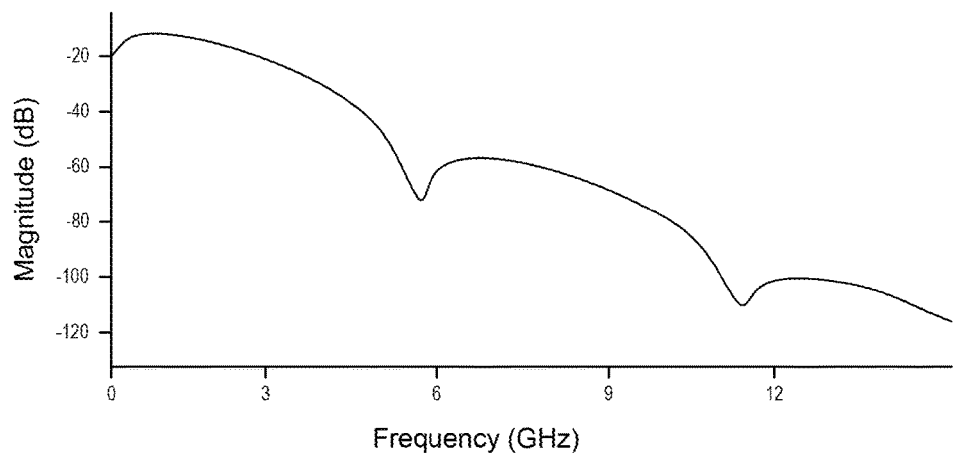
FIG. 5 is a far end crosstalk (FEXT) diagram for strip line circuit traces of the printed circuit board of FIG. 2.

In a particular embodiment, because circuit traces 414 and 416 are routed on a top or bottom surface of printed circuit board 400, the circuit trace experiences frequency dependent losses that are related to the fact that the circuit trace is not routed between power or ground planes, and so the circuit trace is said to be inhomogeneous. As such, circuit traces 414 and 416 are microstrip circuit traces. The loss characteristics of circuit traces 414 and 416 are dependent upon the geometry of the circuit trace, the geometry of the circuit board, the relative permeability, $\varepsilon_{core}$, of prepreg layer 410, and the relative permeability of the air or a soldering layer over the circuit trace. The loss characteristics of circuit traces 414 and 416 can be determined by applying a field solver that evaluates the electromagnetic interactions between the circuit trace and power plane 412. Such a field solver can analyze such factors including the geometry of circuit traces 414 and 416, the overall length of the circuit trace, the dielectric constant of prepreg layer 410, and the like, to determine if the traces will meet a particular design specification. The design specification can include recommended or required values for maximum insertion loss, crosstalk, and the like. If circuit trace 414 does not meet the design specification, then a designer can re-layout the circuit trace to improve the performance. In a particular embodiment, an analysis of circuit trace 414 can provide a far end crosstalk (FEXT) diagram such as is shown in FIG. 5, where the FEXT frequency for an exemplary circuit trace is shown to be worse at approximately 6 and 11 GHz. Here, if the operating frequency of the exemplary circuit trace is expected to be near to the FEXT frequency, then the designer may consider redesigning the circuit trace 416 in order to minimize the FEXT of circuit trace 414 at the design operating frequency. Note that other trace parameters can be utilized in specifying and creating the design, other than the FEXT of the circuit trace. For example, a circuit trace can be specified in terms of near end crosstalk (NEXT), insertion loss, reflection loss, or other parameters, as needed or desired.

Figure 6:
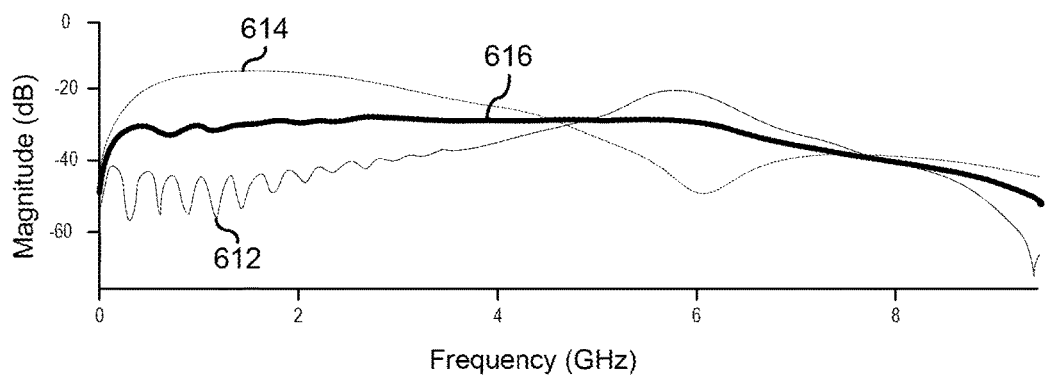
FIG. 6 is a response that includes a floquet mode coupling response of an angularly routed circuit trace and a FEXT of a strip line circuit trace according to an embodiment of the present disclosure.

In a particular embodiment, the designer compares the floquet mode frequency of an angularly routed circuit trace with the FEXT of a nearby strip line circuit trace, and the circuit traces are designed such that the floquet mode frequency coupling loss of the angularly routed circuit trace offsets the FEXT of the strip line circuit trace at a particular frequency of interest, such as at the operating frequency of the angularly routed circuit trace or the operating frequency of the strip line circuit trace. In this way, the overall response at the frequency of interest is flattened out, rendering the signal received at the receiver more easily compensated, and increasing the eye margins at the receiver. FIG. 6 shows a response 600 that includes a floquet mode coupling response 612 of an angularly routed circuit trace and a FEXT 614 of a strip line circuit trace, and a resultant response 616 of the received signal at a receiver end of the strip line circuit trace. The circuit traces associated with responses 612 and 616 have been designed to flatten response 616 for a 6 GHz signal frequency. In a particular embodiment, response 616 is considered to be flattened if there is 5 dB or less of change in the frequency response within 1 GHz of the operating frequency.

Figure 7:
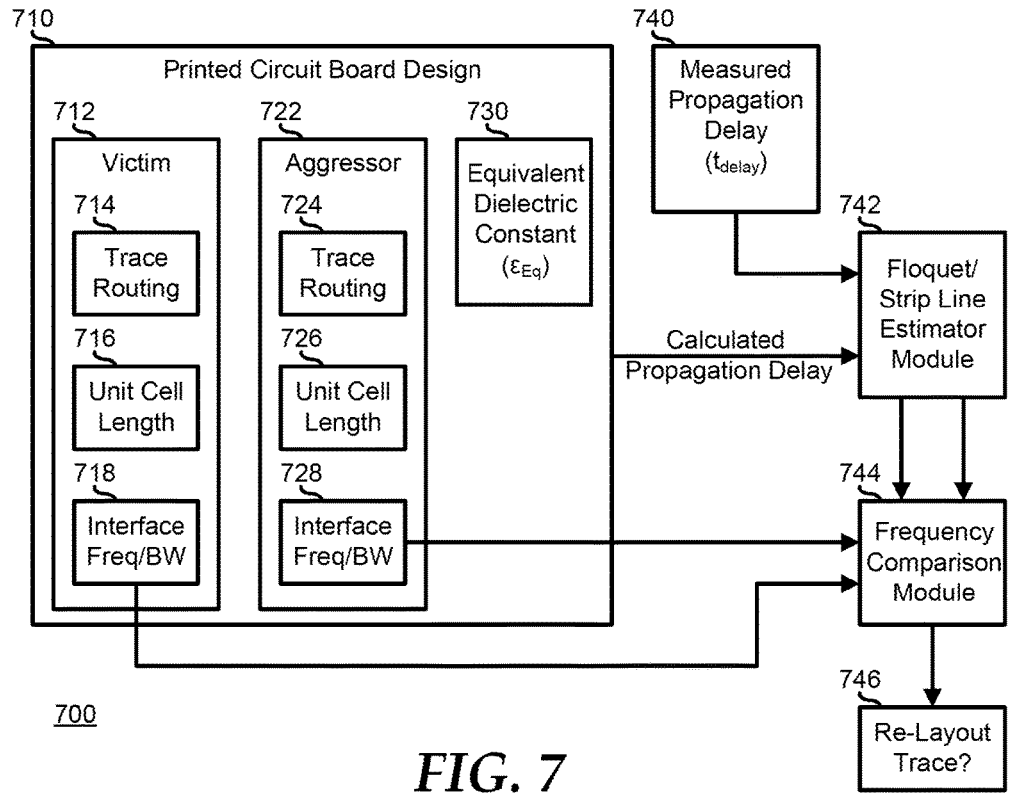
FIG. 7 is a block diagram of a resonance estimating system according to an embodiment of the present disclosure.

FIG. 7 illustrates an embodiment of a resonance estimating system 700 including a printed circuit board design input module 710, a propagation delay input module 740, a floquet/strip line frequency estimator module 742, a frequency comparison module 744, and a trace re-layout module 746. Design input module 710 represents a design depiction of a printed circuit board layout for an information handling system, and can include information related to circuit layout, device placement, and trace routing for the information handling system. As such, design input module 710 can include information regarding multiple circuit traces, in addition to the traces that are designated as victim and aggressor. Thus, the victim trace and the aggressor trace can be selected as being typical of a larger group of similarly designed traces on the printed circuit board. Design input module 710 includes a victim trace design 712, an aggressor trace design 722, and an equivalent dielectric constant value 730.

Victim trace design 712 includes a trace routing 714, a unit cell length 716, and an interface frequency 718. Similarly, Aggressor trace design 212 includes a trace routing 724, a unit cell length 726, and an interface frequency 728. Equivalent dielectric constant value 730 represents an equivalent dielectric constant value for the printed circuit board design that accounts for the differences in the dielectric constant of a core material of the printed circuit board and a pre-preg material of the printed circuit board. In a particular embodiment, equivalent dielectric constant value 730 is determined by taking an average of the dielectric constant of the core material of the printed circuit board and the dielectric constant of the pre-preg material of the printed circuit board. In another embodiment, equivalent dielectric constant value 730 is determined as a byproduct of a field solver analysis of the printed circuit board design, and can yield a more accurate value for the equivalent dielectric constant of the printed circuit board. In yet another embodiment, equivalent dielectric constant value 730 is further determined based upon interface frequencies 718 and 728, in order to yield a yet more accurate value for the equivalent dielectric constant of the printed circuit board. The skilled artisan will recognize that the dielectric constant of many common printed circuit board laminate materials are found to be in the range of 3.5 to 4.5. Thus, for the purpose of further illustration, equivalent dielectric constant value 730 will be assumed to be 4.

Design input module 710 is utilized to determine a propagation delay for signals associated with the victim trace and the aggressor trace through a unit cell, as:

$$t_{delay} = \frac{l_{avg}}{v} \qquad \text{Equation 2}$$

where $t_{delay}$ is the propagation delay, $l_{avg}$ is the average of the unit cell lengths of the victim trace and the aggressor trace, that is:

$$l_{avg} = \frac{l_{victim} + l_{aggressor}}{2} \qquad \text{Equation 3}$$

as can be determined using Equation 1, above, and v is the propagation speed of the printed circuit board material. The propagation speed v is given as:

$$v = \frac{C}{\sqrt{\varepsilon_{eq}}} \qquad \text{Equation 4}$$

where C is the speed of light in a vacuum, and $\varepsilon_{eq}$ is equal to equivalent dielectric constant value 730. For example, where the victim trace has unit cell length 716 is 8 millimeters (mm) and the aggressor trace has unit cell length 726 is 4 mm, $l_{avg}$ is determined by Equation 3 to be 6 mm. Further, assuming equivalent dielectric constant value 730 is 4, the propagation speed v is determined by Equation 4 to be $1.5*10^8$ m/sec. Substituting these values into Equation 3 yields a $t_{delay}$ of 40 picoseconds (ps).

In another embodiment, the propagation delay can be directly measured on an exemplary printed circuit board that has the victim trace and the aggressor trace laid out as specified by design input module 710, using a time domain reflectometer on the traces, and operating at the designated interface frequencies 718 and 728. In this way, an actual measurement for the propagation delay of the unit cells of the victim trace and the aggressor trace can be determined, as needed or desired. In another embodiment, the calculated determination of the propagation delay, as described in Equations 2-4, above, is made, and the measurement using the time domain reflectometer is used as a check on the accuracy of the modeled propagation delay.

Floquet frequency/strip line estimator module 742 receives the one or more of the calculated propagation delay from design input module 710 and from propagation delay input module 740. Floquet frequency/strip line estimator module 742 determines an estimate of the floquet frequency for the victim and aggressor traces as:

$$f_{floquet} = \frac{n}{2t_{delay}}, \text{ where } n = 1, 2, \ldots \qquad \text{Equation 5}$$

and where $f_{floquet}$ is the estimated floquet frequency and n is an integer that identifies the harmonics of the estimated floquet frequency. Floquet frequency/strip line estimator module 742 determines an estimate of the resonance frequency for the victim and aggressor traces as:

$$f_{FEXT-trough} = \frac{n}{\frac{l}{v_E} - \frac{l}{v_O}}, \text{ where } N = 1, 2, \ldots \quad \text{Equation 6}$$

and where:

$$\frac{l}{v_E} - \frac{l}{v_O} = \quad \text{Equation 7}$$
$$l\left(\frac{1}{\sqrt{(L_{11}+L_{12})(C_{11}-C_{12})}} - \frac{1}{\sqrt{(L_{11}-L_{12})(C_{11}+C_{12})}}\right)$$

and where $L_{11}$ and $C_{11}$ are the equivalent input inductance and input capacitance, and $L_{12}$ and $C_{12}$ are the equivalent reverse inductance and reverse capacitance.

Frequency comparison module 444 operates to compare the estimated floquet frequency and the estimated FEXT frequency with interface frequencies 418 and 428. If the estimated floquet frequency and the estimated FEXT frequency are not complimentary to one another, then the configuration is likely to result in undesirable insertion loss and crosstalk, and one or more of the victim trace and the aggressor trace is redesigned in trace re-layout module 446.

Figure 8:
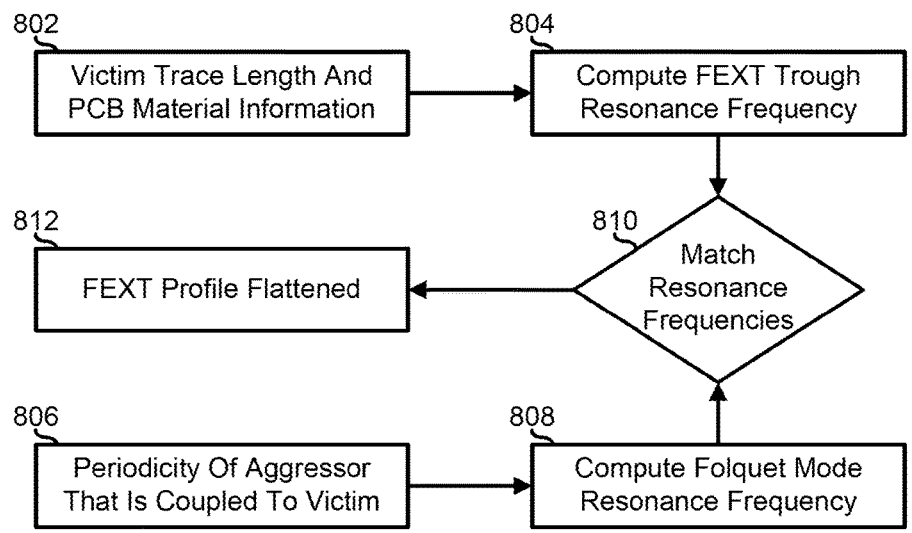
FIG. 8 is a flow chart illustrating a method of cancelling floquet mode resonance and far end crosstalk according to an embodiment of the present disclosure.

FIG. 8 illustrates a method of cancelling floquet mode resonance and far end crosstalk, starting at block 802, where trace length information and PCB material information for a strip line circuit trace are provided. The FEXT trough frequency of the strip line circuit trace is computed in block 804. For example, a floquet frequency/strip line estimator module can calculate a FEXT trough frequency as described above. Periodicity information for an angularly routed circuit trace that is coupled to the strip line circuit trace in block 806. The floquet mode resonance frequency of the angularly routed circuit trace is computed in block 808. For example, a floquet frequency/strip line estimator module can calculate a floquet mode resonance frequency as described above. The FEXT trough frequency from block 804, and the floquet mode resonance frequency from block 808 are compared with the operating frequency of one or more of the strip line circuit trace and the angularly routed circuit trace in block 810, and the FEXT trough frequency and the floquet mode resonance frequency are evaluated to determine if the resulting frequency profile is flattened in block 812.

Figure 9:
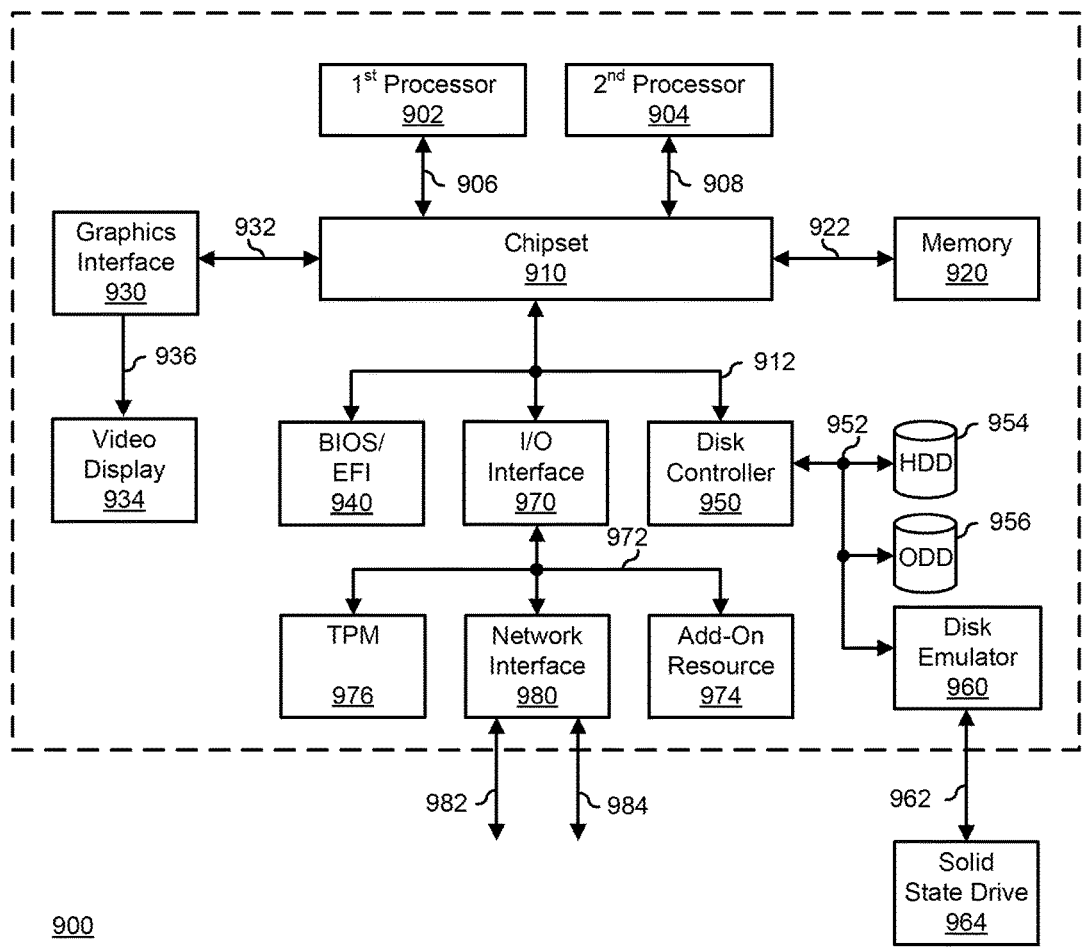
FIG. 9 is a block diagram illustrating a generalized information handling system according to an embodiment of the present disclosure.

FIG. 9 illustrates a generalized embodiment of information handling system 900. For purpose of this disclosure information handling system 900 can include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, information handling system 900 can be a personal computer, a laptop computer, a smart phone, a tablet device or other consumer electronic device, a network server, a network storage device, a switch router or other network communication device, or any other suitable device and may vary in size, shape, performance, functionality, and price. Further, information handling system 900 can include processing resources for executing machine-executable code, such as a central processing unit (CPU), a programmable logic array (PLA), an embedded device such as a System-on-a-Chip (SoC), or other control logic hardware. Information handling system 900 can also include one or more computer-readable medium for storing machine-executable code, such as software or data. Additional components of information handling system 900 can include one or more storage devices that can store machine-executable code, one or more communications ports for communicating with external devices, and various input and output (I/O) devices, such as a keyboard, a mouse, and a video display. Information handling system 900 can also include one or more buses operable to transmit information between the various hardware components.

Information handling system 900 can include devices or modules that embody one or more of the devices or modules described above, and operates to perform one or more of the methods described above. Information handling system 900 includes a processors 902 and 904, a chipset 910, a memory 920, a graphics interface 930, include a basic input and output system/extensible firmware interface (BIOS/EFI) module 940, a disk controller 950, a disk emulator 960, an input/output (I/O) interface 970, and a network interface 980. Processor 902 is connected to chipset 910 via processor interface 906, and processor 904 is connected to the chipset via processor interface 908. Memory 920 is connected to chipset 910 via a memory bus 922. Graphics interface 930 is connected to chipset 910 via a graphics interface 932, and provides a video display output 936 to a video display 934. In a particular embodiment, information handling system 900 includes separate memories that are dedicated to each of processors 902 and 904 via separate memory interfaces. An example of memory 920 includes random access memory (RAM) such as static RAM (SRAM), dynamic RAM (DRAM), non-volatile RAM (NV-RAM), or the like, read only memory (ROM), another type of memory, or a combination thereof.

BIOS/EFI module 940, disk controller 950, and I/O interface 970 are connected to chipset 910 via an I/O channel 912. An example of I/O channel 912 includes a Peripheral Component Interconnect (PCI) interface, a PCI-Extended (PCI-X) interface, a high-speed PCI-Express (PCIe) interface, another industry standard or proprietary communication interface, or a combination thereof. Chipset 910 can also include one or more other I/O interfaces, including an Industry Standard Architecture (ISA) interface, a Small Computer Serial Interface (SCSI) interface, an Inter-Integrated Circuit ($I^2C$) interface, a System Packet Interface (SPI), a Universal Serial Bus (USB), another interface, or a combination thereof. BIOS/EFI module 940 includes BIOS/EFI code operable to detect resources within information handling system 900, to provide drivers for the resources, initialize the resources, and access the resources. BIOS/EFI module 940 includes code that operates to detect resources within information handling system 900, to provide drivers for the resources, to initialize the resources, and to access the resources.

Disk controller 950 includes a disk interface 952 that connects the disc controller to a hard disk drive (HDD) 954, to an optical disk drive (ODD) 956, and to disk emulator 960. An example of disk interface 952 includes an Integrated Drive Electronics (IDE) interface, an Advanced Technology Attachment (ATA) such as a parallel ATA (PATA) interface or a serial ATA (SATA) interface, a SCSI interface, a USB interface, a proprietary interface, or a combination thereof. Disk emulator 960 permits a solid-state drive 964 to be connected to information handling system 900 via an external interface 962. An example of external interface 962 includes a USB interface, an IEEE 1394 (Firewire) interface, a proprietary interface, or a combination thereof. Alternatively, solid-state drive 964 can be disposed within information handling system 900.

I/O interface 970 includes a peripheral interface 972 that connects the I/O interface to an add-on resource 974, to a TPM 976, and to network interface 980. Peripheral interface 972 can be the same type of interface as I/O channel 912, or can be a different type of interface. As such, I/O interface 970 extends the capacity of I/O channel 912 when peripheral interface 972 and the I/O channel are of the same type, and the I/O interface translates information from a format suitable to the I/O channel to a format suitable to the peripheral channel 972 when they are of a different type. Add-on resource 974 can include a data storage system, an additional graphics interface, a network interface card (NIC), a sound/video processing card, another add-on resource, or a combination thereof. Add-on resource 974 can be on a main circuit board, on separate circuit board or add-in card disposed within information handling system 900, a device that is external to the information handling system, or a combination thereof.

Network interface 980 represents a NIC disposed within information handling system 900, on a main circuit board of the information handling system, integrated onto another component such as chipset 910, in another suitable location, or a combination thereof. Network interface device 980 includes network channels 982 and 984 that provide interfaces to devices that are external to information handling system 900. In a particular embodiment, network channels 982 and 984 are of a different type than peripheral channel 972 and network interface 980 translates information from a format suitable to the peripheral channel to a format suitable to external devices. An example of network channels 982 and 984 includes InfiniBand channels, Fibre Channel channels, Gigabit Ethernet channels, proprietary channel architectures, or a combination thereof. Network channels 982 and 984 can be connected to external network resources (not illustrated). The network resource can include another information handling system, a data storage system, another network, a grid management system, another suitable resource, or a combination thereof.

Although only a few exemplary embodiments have been described in detail herein, those skilled in the art will readily appreciate that many modifications are possible in the exemplary embodiments without materially departing from the novel teachings and advantages of the embodiments of the present disclosure. Accordingly, all such modifications are intended to be included within the scope of the embodiments of the present disclosure as defined in the following claims. In the claims, means-plus-function clauses are intended to cover the structures described herein as performing the recited function and not only structural equivalents, but also equivalent structures.

The above-disclosed subject matter is to be considered illustrative, and not restrictive, and the appended claims are intended to cover any and all such modifications, enhancements, and other embodiments that fall within the scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A method comprising:
   providing, on a first printed circuit board, a first circuit trace and a second circuit trace;
   determining a first far end cross-talk (FEXT) response associated with the first circuit trace;
   determining a first time delay associated with the second circuit trace;
   estimating a first floquet response associated with the first time delay;
   comparing the first FEXT response with a first interface frequency associated with the first circuit trace;
   comparing the first floquet response with the first interface frequency; and
   determining whether the first floquet response cancels the first FEXT response on the first circuit trace at the first interface frequency.

2. The method of claim 1, further comprising providing, on a second printed circuit board, a redesigned first circuit trace when the first floquet response does not cancel the first FEXT response on the first circuit trace at the first interface frequency.

3. The method of claim 2, further comprising:
   determining a second FEXT response associated with the redesigned first circuit trace;
   comparing the second FEXT response with the first interface frequency; and
   determining whether the first floquet response cancels the second FEXT response on the redesigned first circuit trace at the first interface frequency.

4. The method of claim 1, further comprising providing, on a second printed circuit board, a redesigned second circuit trace when the first floquet response does not cancel the first FEXT response on the first circuit trace at the first interface frequency.

5. The method of claim 4, further comprising:
   determining a second time delay associated with the redesigned second circuit trace;
   estimating a second floquet response associated with the second time delay;
   comparing the second floquet response with the first interface frequency; and
   determining whether the second floquet response cancels the first FEXT response on the first circuit trace at the first interface frequency.

6. The method of claim 1, wherein the floquet frequency is determined as $$f_{floquet} = \frac{1}{2t_{delay}},$$

where $f_{floquet}$ is the floquet frequency, and $t_{delay}$ is the time delay.

7. The method of claim 1, wherein in determining the time delay, the method further comprises averaging a first unit cell length and a second unit cell length.

8. The method of claim 7, wherein in determining the time delay, the method further comprises calculating an equivalent dielectric constant for the first printed circuit board.

9. The method of claim 1, wherein in determining the time delay, the method further comprises calculating the time delay as $$t_{delay} = \frac{l_{avg}}{v},$$

where $l_{avg}$ is an average of a first unit cell length and a second unit cell length, and v is a propagation velocity in the first printed circuit board.

10. The method of claim 1, wherein in determining the time delay, the method further comprises determining a propagation delay in the first circuit trace and the second circuit trace using a time domain reflectometer.

11. A non-transitory computer-readable medium including code for performing a method, the method comprising:
   providing, on a first printed circuit board, a first circuit trace and a second circuit trace;
   determining a first far end cross-talk (FEXT) response associated with the first circuit trace;
   determining a first time delay associated with the second circuit trace;
   estimating a first floquet response associated with the first time delay;
   comparing the first FEXT response with a first interface frequency associated with the first circuit trace;
   comparing the first floquet response with the first interface frequency; and
   determining whether the first floquet response cancels the first FEXT response on the first circuit trace at the first interface frequency.

12. The non-transitory computer-readable medium of claim 11, further comprising:
   providing, on a second printed circuit board, a redesigned first circuit trace when the first floquet response does not cancel the first FEXT response on the first circuit trace at the first interface frequency.

13. The non-transitory computer-readable medium of claim 12, further comprising:
   determining a second FEXT response associated with the redesigned first circuit trace;
   comparing the second FEXT response with the first interface frequency;
   determining whether the first floquet response cancels the second FEXT response on the redesigned first circuit trace at the first interface frequency.

14. The non-transitory computer-readable medium of claim 11, further comprising:
   providing, on a second printed circuit board, a redesigned second circuit trace when the first floquet response does not cancel the first FEXT response on the first circuit trace at the first interface frequency.

15. The non-transitory computer-readable medium of claim 14, wherein further comprising:
   determining a second time delay associated with the redesigned second circuit trace;
   estimating a second floquet response associated with the second time delay;
   comparing the second floquet response with the first interface frequency; and
   determining whether the second floquet response cancels the first FEXT response on the first circuit trace at the first interface frequency.

16. The non-transitory computer-readable medium of claim 11, wherein the floquet frequency is determined as $$f_{floquet} = \frac{1}{2t_{delay}},$$

where $f_{floquet}$ is the floquet frequency, and $t_{delay}$ is the time delay.

17. The non-transitory computer-readable medium of claim 11, wherein in determining the time delay, the method further comprises averaging a first unit cell length and a second unit cell length.

18. The non-transitory computer-readable medium of claim 11, wherein in determining the time delay, the method further comprises:
   calculating the time delay as $$t_{delay} = \frac{l_{avg}}{v},$$

where $l_{avg}$ is an average of a first unit cell length and a second unit cell length, and v is a propagation velocity in the first printed circuit board.

19. The non-transitory computer-readable medium of claim 11, wherein in determining the time delay, the method further comprises determining a propagation delay in the first circuit trace and the second circuit trace using a time domain reflectometer.

20. An information handling system comprising:
   a memory for storing code; and
   a processor configured to execute code to:
      provide, on a first printed circuit board, a first circuit trace and a second circuit trace;
      determine a first far end cross-talk (FEXT) response associated with the first circuit trace;
      determine a first time delay associated with the second circuit trace;
      estimate a first floquet response associated with the first time delay;
      compare the first FEXT response with a first interface frequency associated with the first circuit trace;
      compare the first floquet response with the first interface frequency; and
      determine whether the first floquet response cancels the first FEXT response on the first circuit trace at the first interface frequency.

* * * * *